(12) United States Patent
Yamada

(10) Patent No.: US 11,444,623 B2
(45) Date of Patent: Sep. 13, 2022

(54) SENSOR DEVICE, METHOD OF CONTROLLING SENSOR DEVICE, AND PROGRAM THEREFOR

(71) Applicant: Alps Alpine Co., Ltd., Tokyo (JP)

(72) Inventor: Tomoki Yamada, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 17/188,873

(22) Filed: Mar. 1, 2021

(65) Prior Publication Data
US 2021/0184675 A1    Jun. 17, 2021

Related U.S. Application Data

(63) Continuation of application No. PCT/JP2019/012229, filed on Mar. 22, 2019.

(30) Foreign Application Priority Data

Sep. 7, 2018  (JP) .............................. JP2018-167887

(51) Int. Cl.
*G06F 3/044* (2006.01)
*G01D 5/24* (2006.01)
(Continued)

(52) U.S. Cl.
CPC ............. *H03K 17/955* (2013.01); *G01D 5/24* (2013.01); *G06F 3/044* (2013.01); *G06F 3/0418* (2013.01); *G06F 3/04166* (2019.05)

(58) Field of Classification Search
CPC ...... H03K 17/955; G01D 5/24; G06F 3/0418; G06F 3/04166; G06F 3/044
See application file for complete search history.

(56) References Cited

U.S. PATENT DOCUMENTS

| 9,866,825 B2 * | 1/2018 | Baik ................... H04N 13/383 |
| 2011/0012618 A1 * | 1/2011 | Teterwak ............ G01D 5/2417 |
| | | 324/686 |

(Continued)

FOREIGN PATENT DOCUMENTS

| CA | 2805431 A1 * | 1/2012 | ......... G02F 1/13338 |
| JP | 2013-135346 | 7/2013 | |
| WO | WO-2016094368 A1 * | 6/2016 | ......... G06F 3/03545 |

OTHER PUBLICATIONS

International Search Report from International Application No. PCT/JP2019/012229 dated Apr. 23, 2019.

*Primary Examiner* — Kwin Xie
(74) *Attorney, Agent, or Firm* — Beyer Law Group LLP

(57) ABSTRACT

A sensor device has: a sensor unit that outputs a sinusoidal detection signal having an amplitude matching a physical quantity to be detected; a reference signal creator that creates a first sinusoidal reference signal having the same frequency and phase as the detection signal; and a demodulator that multiplies the detection signal by the first reference signal and creates, as a first demodulation signal matching the physical quantity, a signal matching a direct-current component included in a signal resulting from the multiplication. The reference signal creator creates a sinusoidal second reference signal having the same frequency as the detection signal but being out of phase with the detection signal. The demodulator multiplies the detection signal by the second reference signal and creates, as a second demodulation signal matching a noise component superimposed on the detection signal, a signal matching a direct-current component included in a signal resulting from the multiplication.

13 Claims, 8 Drawing Sheets

(51) Int. Cl.
*H03K 17/955* (2006.01)
*G06F 3/041* (2006.01)

(56) References Cited

U.S. PATENT DOCUMENTS

| | | |
|---|---|---|
| 2011/0063993 A1 | 3/2011 | Wilson et al. |
| 2013/0257765 A1* | 10/2013 | Lee .................. G06F 3/041 345/173 |
| 2014/0327644 A1* | 11/2014 | Mohindra ............... G06F 3/044 345/174 |
| 2015/0277621 A1* | 10/2015 | Roberson .............. H04J 13/004 345/174 |
| 2015/0286335 A1* | 10/2015 | Haga .................. G06F 3/04182 345/174 |
| 2020/0067495 A1* | 2/2020 | Roberson .......... G06F 3/041662 |

* cited by examiner

SENSOR DEVICE, METHOD OF CONTROLLING SENSOR DEVICE, AND PROGRAM THEREFOR

CLAIM OF PRIORITY

This application is a Continuation of International Application No. PCT/JP2019/012229 filed on Mar. 22, 2019, which claims benefit of Japanese Patent Application No. 2018-167887 filed on Sep. 7, 2018. The entire contents of each application noted above are hereby incorporated by reference.

BACKGROUND OF THE INVENTION

1. Field of the Invention

The present invention relates to a sensor device that creates a detection signal according to an entered driving signal, as well as a method of controlling the sensor device and a program. For example, the present disclosure relates to a sensor device such as a capacitive sensor that detects a capacitance.

2. Description of the Related Art

In a general capacitive sensor that detects a change in capacitance that accompanies the proximity of an object, one or more electrodes are placed at a place that an object will approach. This type of capacitive sensor detects the capacitance of a parasitic capacitor formed between the object and an electrode or between electrodes. A driving signal having a constant amplitude is applied to these electrodes, and charge of the capacitor, the charge changing according to the driving signal, is detected by a charge amplifier. When the amplitude of the driving signal is constant, a change in a detection signal (signal proportional to the charge of the capacitor) represents a change in the capacitance of the capacitor. With capacitive sensors typified by touch pads, touch panels, touch switches, and the like, the proximity of a human body or the like is detected according to this change in capacitance and calculation of coordinates or gesture recognition is performed.

Since, in a capacitive sensor, a minute change occurs in charge of a capacitor parasitically formed by an electrode, noise due to electrostatic coupling between the electrode and the noise source is likely to be mixed and the noise is likely to be superimposed on a detection signal. To reduce a noise component superimposed on the detection signal, a method is generally used in which the detection signal is multiplied by a sinusoidal signal having the same frequency as a driving signal, after which the resulting direct-current component is extracted from the multiplication result by a low-pass filter. Since the direct-current component extracted by the low-pass filter is proportional to the amplitude of a signal component in the detection signal, the signal component having the same frequency as the driving signal, a noise component having a frequency different from the driving signal is effectively removed.

In a sensor described in Japanese Unexamined Patent Application Publication No. 2013-135346, for example, in a circuit that detects a capacitance between two electrodes, a driving signal is applied to one of the two electrodes and a current-to-voltage conversion circuit is connected to the other electrode. An output signal from the current-to-voltage conversion circuit is multiplied by a SIN signal and is also multiplied by a COS signal, the SIN signal and COS signal having the same frequency as a driving signal. The resulting two direct-current components are extracted from the two multiplication results by low-pass filters. The two direct-current components represent the vector of a signal component having the same frequency as the driving signal included in the output signal from the current-to-voltage conversion circuit. Therefore, the amplitude of the signal component, that is, a capacitance, can be obtained from the magnitude of this vector.

SUMMARY OF THE INVENTION

The method in which a detection signal is multiplied by a reference signal having the same frequency as a driving signal and a direct-current component is then extracted is problematic in that a noise component having the same frequency as the driving signal cannot be removed. In view of this, with the sensor described in Japanese Unexamined Patent Application Publication No. 2013-135346 above, when it is decided whether noise having the same frequency as the driving signal is mixed, a direct-current component is extracted in a state in which the application of the driving signal is stopped. Since a component related to a capacitance is not included in the direct-current component extracted in the state in which the application of the driving signal is stopped and substantially only a noise component is included, it is possible to decide, from the magnitude of this direct-current component, whether noise is mixed.

However, if a simple circuit structure is used to create a driving signal and a reference signal according to a common sinusoidal signal, when the creation of the sinusoidal signal is stopped to stop the application of the driving signal, the creation of the reference signal is also stopped. This requires the addition of a circuit that stops only the creation of the driving signal, making the circuit structure complex. Another problem is that if the output impedance of a circuit that creates the driving signal is different between when the driving signal is output and when the output is stopped, the state of electrostatic coupling between the electrode and the noise source changes. This may change the magnitude of the noise component superimposed on the detection signal.

In another possible method of deciding whether noise having the same frequency as the driving signal is mixed, a time-varying change in a direct-current component (for example, the difference between two direct-current components obtained in succession) is used, the direct-current component being extracted from the result of a multiplication between the reference signal and the detection signal. If noise having the same frequency as the driving signal is mixed, it is predicted that the time-varying change in the direct-current component becomes large. Therefore, if the time-varying change in the direct-current component exceeds a predetermined threshold value, it can be decided that noise having the same frequency as the driving signal is mixed.

However, the method in which a time-varying change in a direct-current component is used as described above is disadvantageous in that it is not possible to distinguish between a variation due to noise and a variation caused in the direct-current component when the proximity state of the object changes at high speed. Therefore, if the distance between an object (such a finger) and the electrode changes quickly, an incorrect decision may be made by regarding a variation caused by this change in the direct-current component as a variation caused by noise.

Therefore, the present disclosure provides a sensor device that can examine a noise component superimposed on a detection signal with a simple structure, as well as a method of controlling the sensor device and a program.

A sensor device according to a first aspect of the present disclosure has: a sensor unit that outputs a detection signal of a sine wave, the detection signal having an amplitude matching a physical quantity to be detected; a reference signal creating unit that creates a first reference signal of a sine wave, the first reference signal having a frequency equal to the frequency of the detection signal and also having a phase equal to the phase of the detection signal; and a demodulating unit that multiplies the detection signal output from the sensor unit by the first reference signal and creates, as a first demodulation signal matching the physical quantity to be detected, a signal matching a direct-current component included in a signal obtained as the result of the multiplication. The reference signal creating unit creates a second reference signal of a sine wave, the second reference signal having a frequency equal to the frequency of the detection signal, the phase of the second reference signal being shifted from the phase of the detection signal. The demodulating unit multiplies the detection signal output from the sensor unit by the second reference signal and creates, as a second demodulation signal matching a noise component superimposed on the detection signal, a signal matching a direct-current component included in a signal obtained as the result of the multiplication.

According to the sensor device of the first aspect, a first reference signal having a frequency equal to the frequency of a detection signal and also having a phase equal to the phase of the detection signal and a detection signal output from a sensor unit are multiplied together in a demodulating unit. A direct-current component included in a signal obtained as the result of this multiplication has a magnitude matching the amplitude of the detection signal, that is, a magnitude matching a physical quantity to be detected. Therefore, the first demodulation signal has a magnitude matching the physical quantity to be detected. Also, a second reference signal having a frequency equal to the frequency of the detection signal, the phase of the second reference being shifted from the phase of the detection signal, and the detection signal output from the sensor unit are multiplied together in the demodulating unit. With the second demodulation signal matching a direct-current component included in a signal obtained as the result of this multiplication, the component of a signal having a phase equal to the phase of the detection signal becomes relatively small and a noise component having the same frequency as the detection signal becomes relatively large, when compared with the first demodulation signal. Therefore, the correlation of the second demodulation signal to the detection signal becomes low and the correlation of the second demodulation signal to a noise component having the same frequency as the detection signal becomes high, when compared with the first demodulation signal.

Preferably, the reference signal creating unit may create a signal of a sine wave, the phase of the signal being shifted by a one-fourth cycle from the phase of the detection signal, as the second reference signal.

According to this structure, a second reference signal having a frequency equal to the frequency of the detection signal, the phase of the second reference being shifted by a one-fourth cycle from the phase of the detection signal, and the detection signal output from the sensor unit are multiplied together in the demodulating unit. A direct-current component included in the result of this multiplication does not practically include a component of a signal having a phase equal to the phase of the detection signal, that is, a component matching the detection signal, but has a magnitude matching a noise component having the same frequency as the detection signal. Therefore, the correlation of the second demodulation signal to the detection signal becomes further low and the correlation of the second demodulation signal to a noise component having the same frequency as the detection signal becomes further high.

Preferably, the above sensor device may have a control unit and a driving signal creating unit that creates a driving signal of a sine wave. According to the driving signal that has been entered, the sensor unit may output the detection signal having a frequency equal to the driving frequency of the driving signal. The control unit may calculate a noise amount matching a time-varying change in the second demodulation signal; if the calculated noise amount exceeds a threshold value, the control unit may change the driving frequency.

According to this structure, a noise amount related to a noise component having the same frequency as the detection signal is calculated according to the second demodulation signal. If this noise amount exceeds a threshold value, the driving frequency is changed, so a frequency leading to large noise is not used as the driving frequency. Therefore, the effect on the first demodulation signal due to the mixing of noise is likely to be avoided.

Preferably, the control unit may calculate the noise amount according to a plurality of second demodulation signals created in succession in the demodulating unit.

According to this structure, a noise amount matching a time-varying change in the second demodulation signal is calculated according to a plurality of second demodulation signals created in succession.

Preferably, the above sensor device may have a plurality of sensor units. The demodulating unit may create the first demodulation signal and second demodulation signal for each of the plurality of sensor units. The control unit may calculate the noise amount for each of the plurality of sensor units; if the sum of a plurality of noise amounts calculated for the plurality of sensor units exceeds a threshold value, the control unit may change the driving frequency.

According to this structure, if the sum of a plurality of noise amounts calculated for a plurality of sensor units exceeds a threshold value, it is decided that noise has been mixed and the driving frequency is changed. Therefore, even if noise that affects the whole of the plurality of sensor units is mixed, the effect on the first demodulation signal due to the mixing of noise is likely to be avoided.

Preferably, the above sensor device may have a plurality of sensor units. Each of the plurality of sensor units may output the detection signal with a phase delayed with respect to the driving signal. The demodulating unit may create the first demodulation signal and second demodulation signal for each of the plurality of sensor units. For each of the plurality of sensor units, by using the driving signal, the reference signal creating unit may create the first reference signal used by the demodulating unit to create the first demodulation signal and the second reference signal used by the demodulating unit to create the second demodulation signal. For each of the plurality of sensor units, the control unit may set a delay in the phase of the first reference signal with respect to the driving signal and a delay in the phase of the second reference signal with respect to the driving signal.

According to this structure, even if the detection signal created in each sensor unit has an individual phase delay with respect to the driving signal, it is possible to set a delay in the phase of the first reference signal with respect to the driving signal and a delay in the phase of the second reference signal with respect to the driving signal so as to match this individual phase delay.

Preferably, when changing the driving frequency, the control unit may select, from a plurality of predetermined frequencies, a frequency different from the current driving frequency as a new driving frequency.

According to this structure, since a driving frequency is selected from a plurality of predetermined frequencies, the structure involved in changing the driving frequency can be simplified.

Preferably, in a normal mode in which the physical quantity is detected, the control unit may control the reference signal creating unit so that the first reference signal is created and may also control the demodulating unit so that the first demodulation signal is created; and in a noise detection mode in which the noise is detected, the control unit may control the reference signal creating unit so that the second reference signal is created and may also control the demodulating unit so that the second demodulation signal is created. The control unit may also calculate the noise amount matching a time-varying change in the second demodulation signal created in the noise detection mode; if the noise amount exceeds a threshold value, the control unit may change the driving frequency in the normal mode.

According to this structure, it is possible to use, in the demodulating unit, a circuit that doubles as a circuit that creates the first demodulation signal according to the detection signal and first reference signal and a circuit that creates the second demodulation signal according to the detection signal and second reference signal. Therefore, the circuit structure of the demodulating unit is simplified. The reference signal creating unit does not need to concurrently create the first reference signal and second reference signal. Therefore, the circuit structure of the reference signal creating unit is simplified.

Preferably, the control unit may periodically repeat the creation of the first demodulation signal by the demodulating unit in the normal mode, and after temporarily shifting from the normal mode to the noise detection mode, may periodically repeat an operation to calculate the noise amount.

According to this structure, the creation of the first demodulation signal is repeated in the normal mode, and an operation to shift from the normal mode to the noise detection mode and calculate a noise amount is periodically repeated. Therefore, even if the mixing of noise newly occurs, the driving frequency is automatically changed according to the result of a comparison between the noise amount and the threshold value. Therefore, the effect on the first demodulation signal due to the mixing of noise is likely to be avoided.

Preferably, each time the control unit temporarily shifts to the noise detection mode, the control unit may sequentially select a frequency to be used as the driving frequency from a plurality of predetermined frequencies. When changing the driving frequency, the control unit may select, as a new driving frequency in the normal mode, the driving frequency that was used in the latest noise detection mode in which the second demodulation signal that makes the noise amount smaller than or equal to the threshold value was created.

According to this structure, each time a shift to the noise detection mode is temporarily made, a noise amount is calculated by using a driving frequency selected in succession from a plurality of predetermined frequencies. If the noise amount exceeds a threshold value in the noise detection mode, the driving frequency in the latest noise detection mode in which the second demodulation signal that makes a noise amount smaller than or equal to the threshold value was created is used as a new driving frequency in the normal mode. Thus, a frequency leading to small noise is likely to be selected at the latest time as the driving frequency, so the effect on the first demodulation signal due to the mixing of noise is likely to be avoided.

Preferably, the above sensor device may have a driving signal creating unit that creates a driving signal of a sine wave. The sensor unit may include at least one electrode that forms a capacitor the capacitance of which changes according to the degree of the proximity of an object, and may also include a capacitance detection circuit that applies the driving signal to the capacitor through the electrode to create the detection signal matching charge transferred to the capacitor when the driving signal is applied, the detection signal having an amplitude matching the capacitance of the capacitor.

According to this structure, in the sensor device that detects a change in capacitance, the change matching the degree of the proximity of an object, it is possible to examine a noise component having the same frequency as the driving signal, the noise component being superimposed on the detection signal.

A control method according to a second aspect of the present disclosure relates to a method of controlling a sensor device that has: a driving signal creating unit that creates a driving signal of a sine wave; a sensor unit that outputs, according to the driving signal that has been entered, a detection signal of a sine wave, the detection signal having a frequency equal to the driving frequency of the driving signal and also having an amplitude matching a physical quantity to be detected; a reference signal creating unit that creates a first reference signal of a sine wave, the first reference signal having a frequency equal to the frequency of the detection signal and also having a phase equal to the phase of the detection signal; and a demodulating unit that multiplies the detection signal output from the sensor unit by a first reference signal and creates, as a first demodulation signal matching the physical quantity to be detected, a signal matching a direct-current component included in a signal obtained as the result of the multiplication. This method of controlling the sensor device has: controlling, in a normal mode in which the physical quantity is detected, the reference signal creating unit so that the first reference signal is created; controlling, in the normal mode, the demodulating unit so that the first demodulation signal is created; controlling, in a noise detection mode in which the noise is detected, the reference signal creating unit so that a second reference signal of a sine wave is created, the second reference signal having a frequency equal to the frequency of the detection signal, the phase of the second reference signal being shifted from the phase of the detection signal; controlling, in the noise detection mode, the demodulating unit so that the detection signal output from the sensor unit is multiplied by the second reference signal and a signal matching a direct-current component included in a signal obtained as the result of the multiplication is created as a second demodulation signal matching a noise component superimposed on the detection signal; calculating a noise amount matching a time-varying change in the second demodulation signal created in the noise detection mode; and changing, if the noise amount exceeds a threshold value, the driving frequency in the normal mode.

A program according to a third aspect of the present disclosure, which may be stored in a computer readable medium, causes a computer to execute the method, according to the second aspect, of controlling a sensor device.

According to the present invention, it is possible to provide a sensor device that can examine a noise component superimposed on a detection signal with a simple structure, as well as a method of controlling the sensor device and a program.

DESCRIPTION OF THE PREFERRED EMBODIMENTS

A sensor device according to an embodiment will be described with reference to the drawings.

Figure 1:
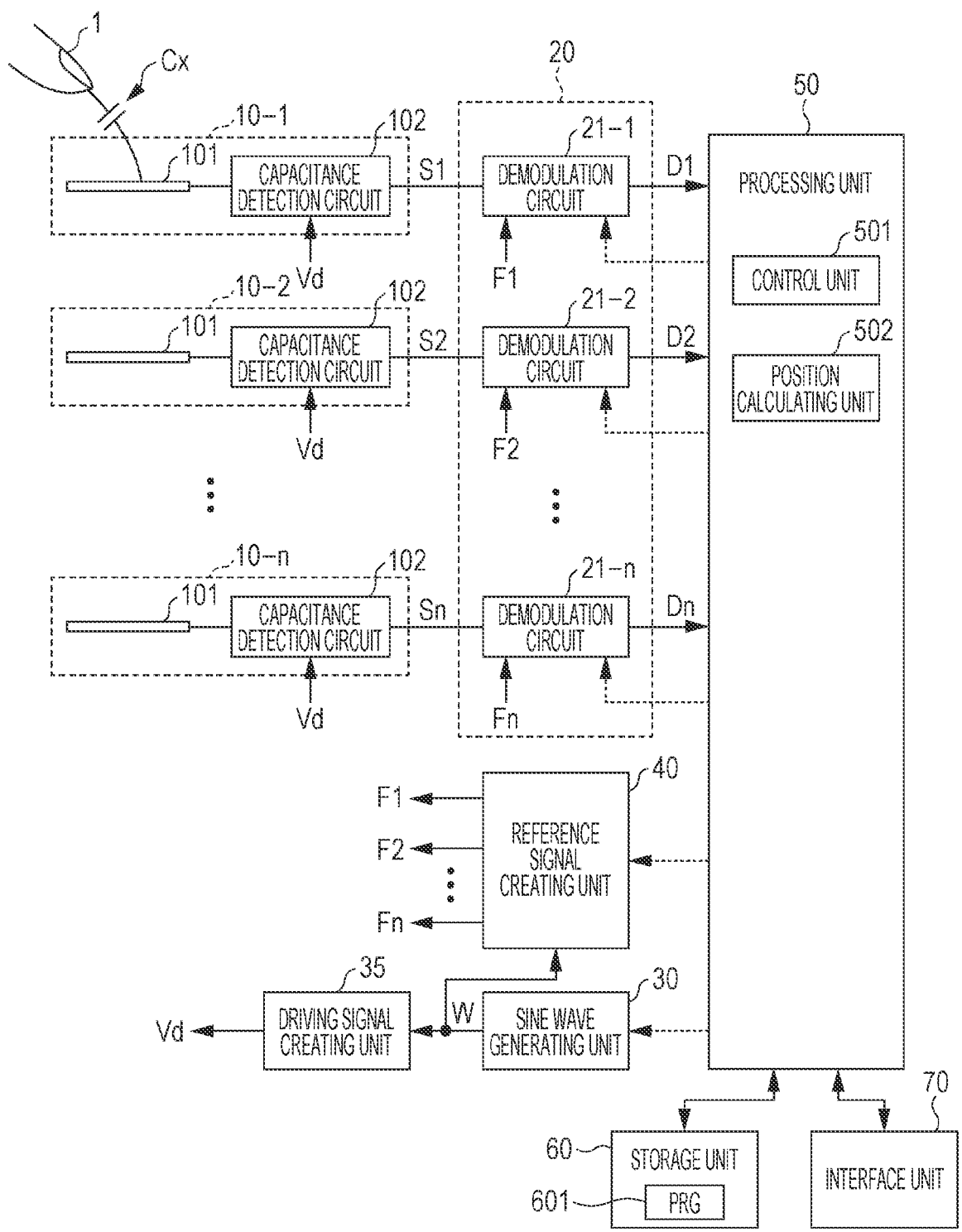
FIG. 1 illustrates an example of the structure of a sensor device according to an embodiment.

FIG. 1 illustrates an example of the structure of the sensor device according to this embodiment. The sensor device illustrated in FIG. 1 has a plurality of sensor units 10-1 to 10-$n$ (also referred to below as sensor units 10 without distinguishing each sensor unit), a demodulating unit 20, a sine wave generating unit 30, a driving signal creating unit 35, a reference signal creating unit 40, a processing unit 50, a storage unit 60, and an interface unit 70.

The sensor device according to this embodiment detects a change in capacitance that accompanies the proximity of an object such as finger. The sensor device is, for example, a touch pad, a touch panel, a touch switch, or the like that detects a change in capacitance that accompanies the proximity of an object and performs various types of processing (such as a decision about a contact and calculation of the coordinates of a contact position). The tem "proximity" in this description refers to closeness to a target and applies regardless of whether there is a contact with the target.

Sensor Unit 10

A sensor unit 10-$i$ (i is an integer from 1 to n) may output a detection signal Si (also referred to below as a detection signal S without making a distinction) matching the degree of the proximity of an object 1 such as a finger. Specifically, according to a driving signal Vd, of a sine wave, that has been entered, the sensor unit 10-$i$ may create a detection signal Si, of a sine wave, that has a frequency equal to the driving frequency fd of the driving signal Vd, has a predetermined phase $\phi i$ (also referred to below as a phase $\phi$ without making a distinction) with respect to the driving signal Vd, and has an amplitude matching the capacitance of a capacitor Cx, the capacitor changing according to the proximity state of the object 1.

The phase $\phi i$ of the detection signal Si with respect to the driving signal Vd is an intrinsic value that the detection signal Si in the sensor unit 10-$i$ has. That is, the detection signal S created in each sensor unit 10 has an individual phase $\phi$ with respect to the driving signal Vd.

Figure 2:
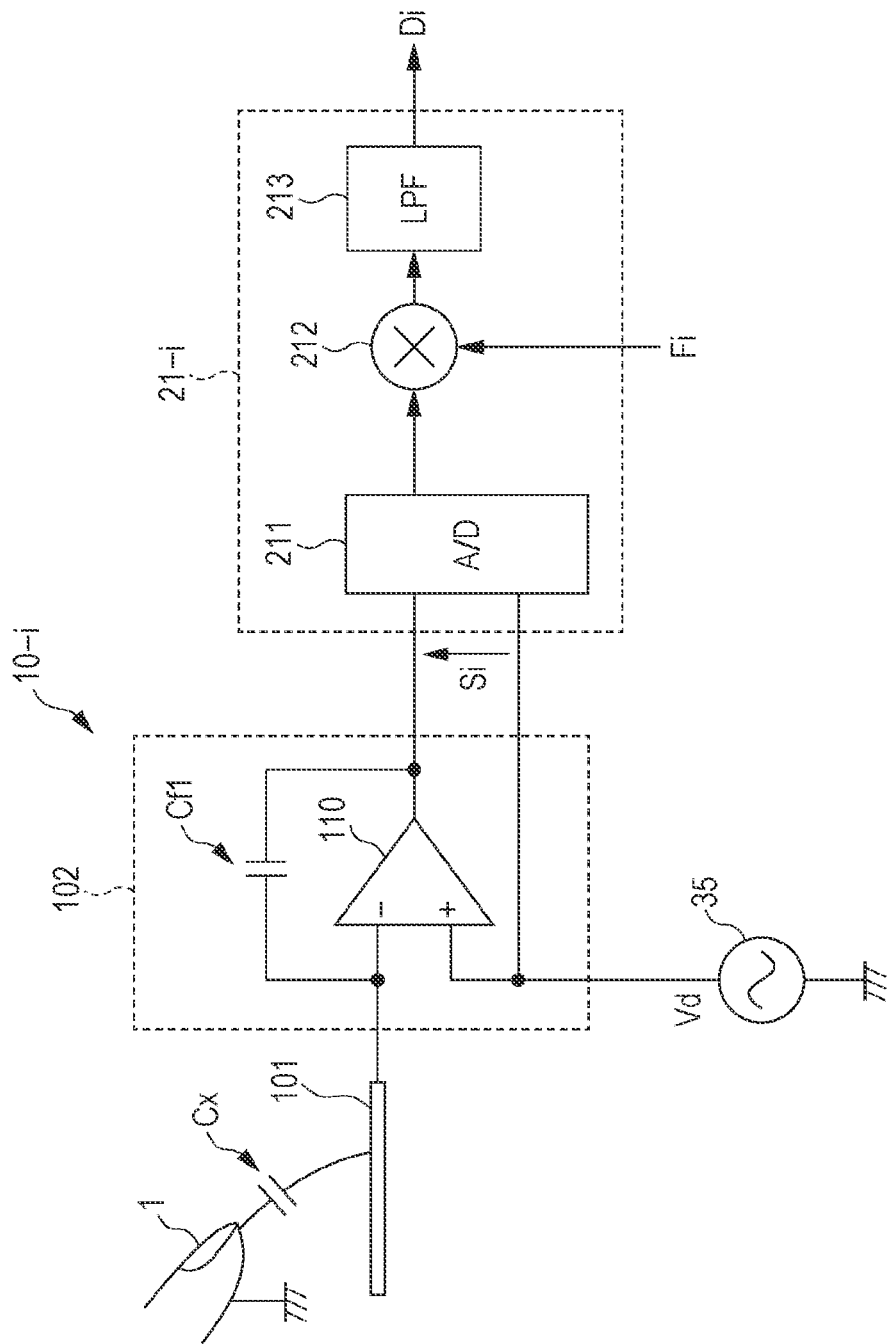
FIG. 2 illustrates an example of the structures of a capacitance detection circuit and demodulation circuit in the sensor device in FIG. 1.

The sensor unit 10-$i$ may include a capacitance detection circuit 102 and an electrode 101 placed at a place that the object 1 such as a finger will approach, as illustrated in, for example, FIG. 2. The electrode 101 may form a capacitor Cx, the capacitance of which changes according to the degree of the proximity of the object 1. The capacitor Cx is a parasitic component formed between the object 1 such as a finger that can be regarded as a conductor having ground potential from the viewpoint of alternating current and the electrode 101. The closer the object 1 is to the electrode 101, the larger the capacitance of the capacitor Cx is.

The capacitance detection circuit 102 may create the detection signal Si matching the capacitance of the capacitor Cx according to charge transferred to the capacitor Cx through the electrode 101. The capacitance detection circuit 102 may apply the driving signal Vd to the capacitor Cx through the electrode 101 and may create the detection signal Si matching the charge transferred to the capacitor Cx when the driving signal Vd is applied. The detection signal Si has an amplitude matching the capacitance of the capacitor Cx.

The capacitance detection circuit 102 includes an operational amplifier 110 and a capacitor Cf1 as illustrated in, for example, FIG. 2. The capacitor Cf1 is connected between the inverting input terminal and output terminal of the operational amplifier 110. The driving signal Vd of a sine wave is supplied to the non-inverting input terminal of the operational amplifier 110 by the driving signal creating unit 35. The electrode 101 is connected to the non-inverting input terminal of the operational amplifier 110. The driving signal Vd has, for example, an alternating-current voltage of a sine wave. Since the operational amplifier 110 controls an output voltage so that the voltage of the inverting input terminal and the voltage of the non-inverting input terminal of the operational amplifier 110 substantially match, an alternating-current voltage substantially the same as the voltage of the driving signal Vd is generated in the capacitor Cx. When an alternating-current voltage is generated in the capacitor Cx, a change in charge occurs in proportion to this alternating-current voltage and the capacitance of the capacitor Cx. The change in charge in the capacitor Cx is almost equal to a change in charge in the capacitor Cf1. As a result, an alternating-current voltage generated in the capacitor Cf1 has an amplitude substantially proportional to the capacitance of the capacitor Cx. The detection signal Si is a voltage generated across the output terminal of the operational amplifier 110 and its non-inverting input terminal, and is substantially equal to the alternating-current voltage generated in the capacitor Cf1. Therefore, the detection signal Si has an amplitude substantially proportional to the capacitance of the capacitor Cx.

Sine Wave Generating Unit 30

The sine wave generating unit 30 creates a sinusoidal signal W, from which the driving signal Vd is created, under control of a control unit 501, which will be described later, in the processing unit 50. The sine wave generating unit 30 is, for example, a digital circuit that operates in synchronization with a clock from the processing unit 50. The sinusoidal signal W is a digital signal set to the driving frequency fd.

Driving Signal Creating Unit 35

The driving signal creating unit 35 creates the driving signal Vd of a sine wave, the driving signal Vd being an analog signal, from the sinusoidal signal W created in the sine wave generating unit 30. Although the driving signal Vd is an alternating-current voltage of a sine wave in an example, the driving signal Vd may be an alternating-current voltage of a non-sine wave (for example, a rectangular wave) in another example. When the driving signal Vd is an alternating-current voltage of a sine wave, harmonic noise released from the electrode 101 can be reduced.

Reference Signal Creating Unit 40

The reference signal creating unit 40 creates reference signals F1 to Fn (also referred to below as reference signals F without distinguishing each reference signal), which are used for multiplications with detection signals S1 to Sn in the demodulating unit 20 described later. The reference signal Fi is used for a multiplication with the detection signal Si.

The sensor device according to this embodiment has two operation modes, normal mode and noise detection mode. In the normal mode, the capacitance of the capacitor Cx is detected. In the noise detection mode, a noise component superimposed on the detection signal Si is detected. In the normal mode and noise detection mode, the reference signal creating unit 40 changes the phase of the reference signal Fi by a one-fourth cycle ($\pi/2$ radians).

That is, in the normal mode, the reference signal creating unit 40 creates a reference signal Fi, of a sine wave, that has a frequency equal to the frequency of the detection signal Si of a sine wave and also has a phase equal to the phase of the detection signal Si of a sine wave (also referred to below as the first reference signal FAi). Specifically, according to the driving signal Vd entered from the driving signal creating unit 35, the reference signal creating unit 40 creates the first reference signal FAi that has a frequency equal to the driving frequency fd and also has a predetermined phase $\phi i$ with respect to the driving signal Vd.

In the noise detection mode, the reference signal creating unit 40 may create the reference signal Fi, of a sine wave, that has a frequency equal to the frequency of the detection signal Si of a sine wave and the phase of which is shifted by a one-fourth cycle from the phase of the detection signal Si of a sine wave (also referred to below as the second reference signal FBi). Specifically, the reference signal creating unit 40 may create the second reference signal FBi that has a frequency equal to the driving frequency fd and the phase of which is shifted by a one-fourth cycle when compared with the phase of the first reference signal FAi, the phase being with respect to the driving signal Vd.

The first reference signal FAi in the normal mode has substantially the same phase as the detection signal Si, but the second reference signal FBi in the noise detection mode has a phase shifted by a one-fourth cycle from the phase of the detection signal Si.

Figure 3:
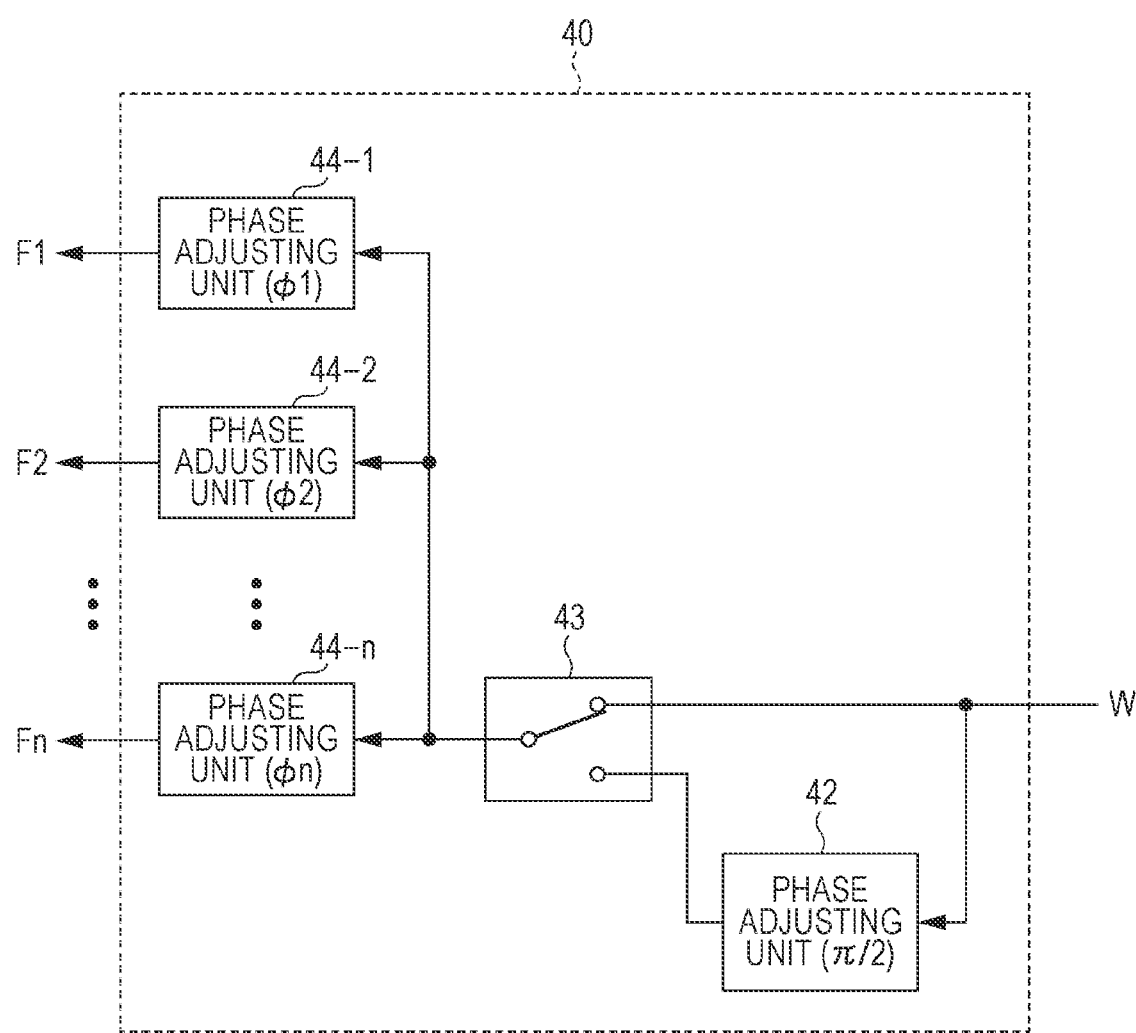
FIG. 3 illustrates an example of the structure of a reference signal creating unit in the sensor device in FIG. 1.

FIG. 3 illustrates an example of the structure of the reference signal creating unit 40. The reference signal creating unit 40 in FIG. 3 has a phase adjusting unit 42, a multiplexer 43, and phase adjusting units 44-1 to 44-$n$. The phase adjusting unit 42 outputs a signal the phase of which is shifted by a one-fourth cycle ($\pi/2$ radians) from the phase of the sinusoidal signal W. The multiplexer 43 selects the sinusoidal signal W in the normal mode and also selects an output signal from the phase adjusting unit 42 in the noise detection mode. The phase adjusting unit 44-$i$ accepts the signal selected in the multiplexer 43, and outputs, as the reference signal Fi, a signal that has been adjusted so as to have a phase $\phi i$ with respect to this input signal.

Demodulating Unit 20

The demodulating unit 20 respectively demodulates the detection signals S1 to Sn with the reference signal F1 to Fn and creates demodulation signals D1 to Dn (also referred to below as demodulation signals D without distinguishing each demodulation signal) that represent the demodulation results. The demodulation signal Di is a signal resulting from demodulating the detection signal Si with the reference signal Fi.

The demodulating unit 20 includes n demodulation circuits 21-1 to 21-$n$ (also referred to below as demodulation circuits 21 without distinguishing each demodulation circuit) as indicated in, for example, FIG. 1. The demodulation circuit 21-$i$ demodulates the detection signal Si with the reference signal Fi and creates the demodulation signal Di. That is, the demodulation circuit 21-$i$ multiplies the detection signal Si by the reference signal Fi and creates, as the demodulation signal Di, a signal matching a direct-current component included in a signal obtained as the result of the multiplication as the demodulation signal Di.

Since, as described above, there is a phase shift of one-fourth cycle between the first reference signal FAi in the normal mode and the second reference signal FBi in the noise detection mode, the demodulation signal Di created by the demodulation circuit 21-$i$ also has different properties between the normal mode and the noise detection mode. In the description below, the demodulation signal Di in the normal mode will be referred to as the first demodulation signal DAi, and the demodulation signal Di in the noise detection mode will be referred to as the second demodulation signal DBi.

The first demodulation signal DAi is a signal matching a direct-current component included in a signal obtained as the result of multiplication between the detection signal Si and the first reference signal FAi. When the detection signal Si is represented as $As\cdot Sin(\omega t-\phi i)$, the first reference signal FAi is represented as $Af\cdot Sin(\omega t-\phi i)$ and the angular frequency $\omega$ is represented as $2\pi fd$, then a signal Y1 obtained by multiplying the detection signal Si and first reference signal FAi together is represented by the following equation.

$$Y1 = As \cdot \text{Sin}(\omega t - \phi i) \times Af \cdot \text{Sin}(\omega t - \phi i) \quad (1)$$
$$= -K \cdot \text{COS}(2\omega t - 2\phi i) + K$$

where $K = As \cdot Af / 2$

The first demodulation signal DAi is a signal matching the direct-current component of the signal Y1 indicated in equation (1) and thereby has a magnitude proportional to K. Therefore, the first demodulation signal DAi created by the demodulation circuit 21-$i$ in the normal mode has a magnitude matching the capacitance of the capacitor Cx.

When the second reference signal FBi, the phase of which is shifted by a one-fourth cycle ($\pi/2$ radians) from the phase of the detection signal Si, is represented as $Af\cdot Sin(\omega t-\phi i-\pi/2)$, then a signal Y2 obtained by multiplying the detection signal Si and second reference signal FBi together is represented by the following equation.

$$Y2 = As \cdot \text{Sin}(\omega t - \phi i - \pi/2) \times Af \cdot \text{Sin}(\omega t - \phi i) \quad (2)$$
$$= -K \cdot \text{COS}(2\omega t - 2\phi i) + K \cdot \text{COS}(\pi/2)$$

The second demodulation signal DBi is a signal matching the direct-current component of the signal Y2 indicated in equation (2), and COS($\pi$/2) in equation (2) is zero. If no noise component is superimposed on the detection signal Si at all, therefore, the direct-current component of the signal Y2 becomes zero, so the second demodulation signal DBi also becomes zero (or becomes a reference value equivalent to zero). Conversely, the second demodulation signal DBi has the same frequency as the driving frequency fd and also has a magnitude matching a noise component having a phase different from the detection signal Si. Therefore, the second demodulation signal DBi created by the demodulation circuit 21-$i$ in the noise detection mode has a magnitude matching a noise component having the same frequency as the driving frequency fd, the noise component being superimposed on the detection signal Si.

The demodulation circuit 21-$i$ has an A/D converter 211 that converts the detection signal Si in analog form to a digital signal, a multiplication circuit 212, and a low-pass filter 213, as illustrated in, for example, FIG. 2. The A/D converter 211 includes, for example, a differential amplifier that amplifies the difference between the driving signal Vd and an output signal from the operational amplifier 110 and also functions as a low-pass filter that prevents aliasing. The A/D converter 211 converts an output signal (signal equivalent to the alternating-current voltage of the capacitor Cf1) from this differential amplifier to a digital signal. The multiplication circuit 212 multiplies the detection signal Si that has been converted to a digital signal in the A/D converter 211 and the reference signal Fi (first reference signal FAi or second reference signal FBi) together. The low-pass filter 213 removes a harmonic component included in a signal obtained as the result of the multiplication in the multiplication circuit 212, and extracts a direct-current component. The direct-current component extracted in the low-pass filter 213 is output to the processing unit 50 described later as the demodulation signal Di.

In the example of the demodulating unit 20 illustrated in FIG. 1, n demodulation signals D are created by using n demodulation circuits 21. However, by connecting a plurality of sensor units 10 to one demodulation circuit 21 by using a multiplexer or the like, n demodulation signals D may be created by using a smaller number of demodulation circuits 21 than n.

Processing Unit 50

The processing unit 50 is a circuit that controls the whole operation of an input device. For example, the processing unit 50 includes one or more computers that perform processing according to instruction code in a program 601 stored in the storage unit 60 and special hardware (a logic circuit or the like) structured so as to implement a specific function. All processing by the processing unit 50 may be executed according to the program 601 in the one or more computers, or at least part of the processing may be executed by the special hardware.

The processing unit 50 includes a control unit 501 and a position calculating unit 502 as illustrated in, for example, FIG. 1. The control unit 501 controls signal creation timings and the like in individual circuits (sensor unit 10, demodulating unit 20, sine wave generating unit 30, driving signal creating unit 35, and reference signal creating unit 40) so that individual signals (sinusoidal signal W, reference signals F, driving signal Vd, detection signal S, and demodulation signal D) are appropriately created in individual operation modes (normal mode and noise detection mode).

Specifically, in the normal mode, the control unit 501 may control the reference signal creating unit 40 so that the first reference signal FAi is created and may also control the demodulating unit 20 so that the first demodulation signal DAi is created; and in the noise detection mode, the control unit 501 may control the reference signal creating unit 40 so that the second reference signal FBi is created and my also control the demodulating unit 20 so that the second demodulation signal DBi is created.

Furthermore, the control unit 501 may calculate a noise amount according to a time-varying change in the second demodulation signal DBi created in the noise detection mode; if the noise amount exceeds a threshold value, the control unit 501 may change the driving frequency fd in the normal mode.

First, the control unit 501 calculates n noise amounts N1 to Nn (also referred to below as noise amounts N without distinguishing each noise amount) corresponding to n second demodulation signals DB1 to DBn. When the control unit 501 calculates the noise amount Ni corresponding to the second demodulation signal DBi, the control unit 501 may calculate the noise amount Ni matching a time-varying change in the second demodulation signal DBi according to a plurality of second demodulation signals DBi created in succession.

For example, the control unit 501 may calculate the absolute value of the difference between two second demodulation signal DBi created in succession as the noise amount Ni. Alternatively, the control unit 501 may calculate the absolute value of the difference between each two second demodulation signal DBi created in succession for all of three or more second demodulation signals DBi created in succession, and may calculate the total of all calculated absolute values of the differences as the noise amount Ni. Alternatively, the control unit 501 may calculate, as the noise amount Ni, the difference (absolute value) between the maximum value and minimum value in three or more second demodulation signals DBi created in succession, or may calculate, as the noise amount Ni, a distribution of a plurality of second demodulation signals DBi created in succession. That is, the noise amount Ni only needs to be a value that represents a time-varying change in the second demodulation signal DBi. The method of calculating the value may be appropriately selected according to the aspect to be practiced.

The control unit 501 may also use one noise amount Ni obtained by a method as described above without alteration as the calculation result of the noise amount Ni. Alternatively, the control unit 501 may use the average of a plurality of noise amounts Ni acquired in succession, the average being obtained by a moving average method or the like, as the calculation result of the noise amount Ni.

Next, the control unit 501 decides whether noise is mixed, according to the calculation results of n noise amounts N1 to Nn. For example, the control unit 501 obtains one representative value of noise amounts according to the calculation results of n noise amounts N1 to Nn; and if this representative value of noise amounts exceeds a predetermined threshold value, the control unit 501 decides that noise is mixed. The representative value of noise amounts may be, for example, the total of the calculation results of n noise amounts N1 to Nn (or the average of them) or may be the maximum value of n noise amounts N1 to Nn.

Also, the control unit 501 may compare each of the calculation results of n noise amounts N1 to Nn with a threshold value; and if the number of noise amounts, in n noise amounts N1 to Nn, that exceed their threshold values reaches a predetermined number, the control unit 501 may decide that noise is mixed.

If the control unit 501 decides, according to the calculation results of n noise amounts N1 to Nn, that noise is mixed, the control unit 501 may changes the driving frequency fd. When changing the driving frequency fd, the control unit 501 may select, from a plurality of predetermined frequencies, a frequency different from the current driving frequency fd as a new driving frequency fd.

For example, the control unit 501 may periodically repeat the creation of the first demodulation signal DAi by the demodulating unit 20 in the normal mode, and after temporarily shifting from the normal mode to the noise detection mode, may periodically repeat an operation to calculate the noise amounts N1 to Nn. That is, the control unit 501 may periodically repeat an operation to calculate the noise amounts N1 to Nn and decide whether noise is mixed. Also, each time the control unit 501 temporarily shifts to the noise detection mode, the control unit 501 may sequentially select a frequency to be used as the driving frequency fd from a plurality of predetermined frequencies. That is, each time the control unit 501 temporarily shifts to the noise detection mode, the control unit 501 may change the driving frequency fd, may calculate the noise amounts N1 to Nn, and may decide whether noise is mixed. If the control unit 501 decides, according to the calculation results of the noise amounts N1 to Nn, that noise is mixed, the control unit 501 may identify the driving frequency fd that was used in the latest noise detection mode in which the second demodulation signal DBi that makes a noise amount smaller than or equal to the threshold value was created (the latest noise detection mode in which it was decided that noise is not mixed), and may select this identified driving frequency fd as a new driving frequency fd in the normal mode.

The position calculating unit 502 calculates a position that the object 1 such as a finger has approached, according to the first demodulation signals DA1 to DAn created in the demodulating unit 20. For example, the electrodes 101 in the sensor units 10-1 to 10-$n$ are placed on the manipulation surface so that the object 1 will approach so as to be aligned in two directions (X direction and Y direction). The position calculating unit 502 calculates the proximity position (coordinate in the X direction and coordinate in the Y direction) of the object 1 on the manipulation surface, according to a distribution of a group of first demodulation signals DAi corresponding to electrodes 101 aligned in the X direction and a distribution of a group of first demodulation signals DAi corresponding to electrodes 101 aligned in the Y direction.

Storage Unit 60

The storage unit 60 stores constant data used in processing in the processing unit 50 and variable data temporarily referenced in a process of processing. The storage unit 60 also stores the program 601 executed by a computer in the processing unit 50. The storage unit 60 includes, for example, one or more of a volatile memory such as a dynamic random access memory (DRAM) or static random access memory (SRAM), a non-volatile memory such as a flash memory, and a magnetic storage device such as a hard disk drive.

Interface Unit 70

The interface unit 70 is a circuit used to transmit and receive data between the sensor device and another control device (such as an integrated circuit (IC) chip for use for control of an electronic unit in which the sensor device is mounted). The processing unit 50 outputs information (such as information about the coordinates of the object 1) stored in the storage unit 60, from the interface unit 70 to a control device (not illustrated). The interface unit 70 may also acquire the program 601 executed by the computer in the processing unit 50 from a non-temporary storage medium such as an optical disc or a universal serial bus (USB) memory or from a server on a network, and may load the program 601 in the storage unit 60.

Figure 4:
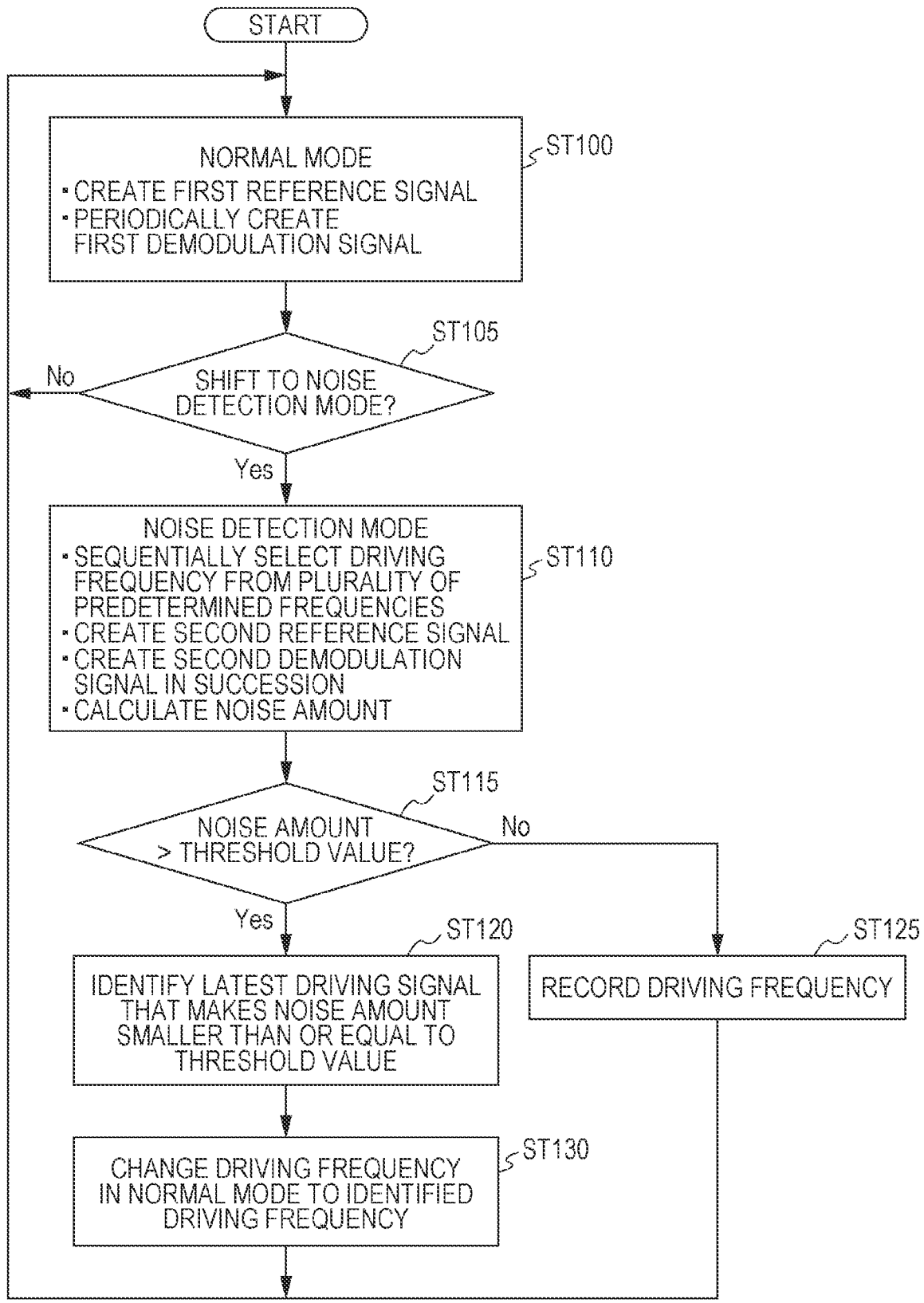
FIG. 4 is a flowchart used to illustrate an example of the operation of the sensor device in FIG. 1.

Here, the operation of the sensor device having the structure described above will be described with reference to the flowchart illustrated in FIG. 4.

When the control unit 501 sets the operation mode to the normal mode, the control unit 501 periodically repeats the creation of the first demodulation signals DA1 to DAn in the demodulating unit 20 while creating first reference signals FA1 to FAn in the reference signal creating unit 40 (ST100). The position calculating unit 502 calculates the coordinates of the proximity position of the object 1 according to the created first demodulation signals DA1 to DAn.

The control unit 501 monitors a time to periodically shift to the noise detection mode while executing the operation in the normal mode (ST105). When the time to shift to the noise detection mode comes (Yes in ST105), the control unit 501 temporarily switches the operation mode from the normal mode to the noise detection mode (ST110).

Upon the shift to the noise detection mode, the control unit 501 selects a frequency to be set as the driving frequency fd from a plurality of predetermined frequencies. If the plurality of predetermined frequencies are assumed to be f1, f2, f3, f4, and f5, the control unit 501 sequentially selects a frequency to be used as the driving frequency fd from these five frequencies. It will be assumed here that, for example, the sequence of the five frequencies has been determined to be f1, f2, f3, f4, f5, f1, f2, f3, • • • . Then, if the frequency used in the previous noise detection mode is f3, the control unit 501 selects f4, which is next after f3, as the frequency to be used as the driving frequency fd in the current noise detection mode (ST110).

The control unit 501 creates the sinusoidal signal W having the selected driving frequency fd in the sine wave generating unit 30 and sets the driving frequency fd of the driving signal Vd accordingly. The control unit 501 also repeats the creation of the second demodulation signals DB1 to DBn in the demodulating unit 20 while creating second reference signals FB1 to FBn in the reference signal creating unit 40 (ST110).

The control unit 501 calculates the noise amount Ni, which represents a time-varying change in the second demodulation signal DBi, according to a plurality of second demodulation signals DBi created in succession in the noise detection mode. The control unit 501 then obtains a representative value of the noise amounts from the calculation results of n calculated noise amounts Ni to Nn (ST110), and decides whether this representative value of the noise amounts exceeds a predetermined threshold value (ST115).

If the representative value of the noise amounts is smaller than or equal to the predetermined threshold value (No in ST115), the control unit 501 records the current driving frequency fd as the driving frequency fd in the latest noise detection mode in which the noise amount was decided to be smaller than or equal to the threshold value in ST115 (ST125). The control unit 501 then returns the operation mode from the noise detection mode to the normal mode and repeats the operation in step ST100.

If the representative value of the noise amounts exceeds the predetermined threshold value (Yes in ST115), the control unit 501 identifies the driving frequency fd in the latest noise detection mode in which the second demodulation signal DBi that makes a noise amount smaller than or equal to the threshold value was created (driving frequency fd recorded last in step ST125) (ST120), and selects this identified driving frequency fd as a new driving frequency fd in the next normal mode (ST130). After that, the control unit 501 returns the operation mode from the noise detection mode to the normal mode and repeats the operation in step ST100.

Figure 5:
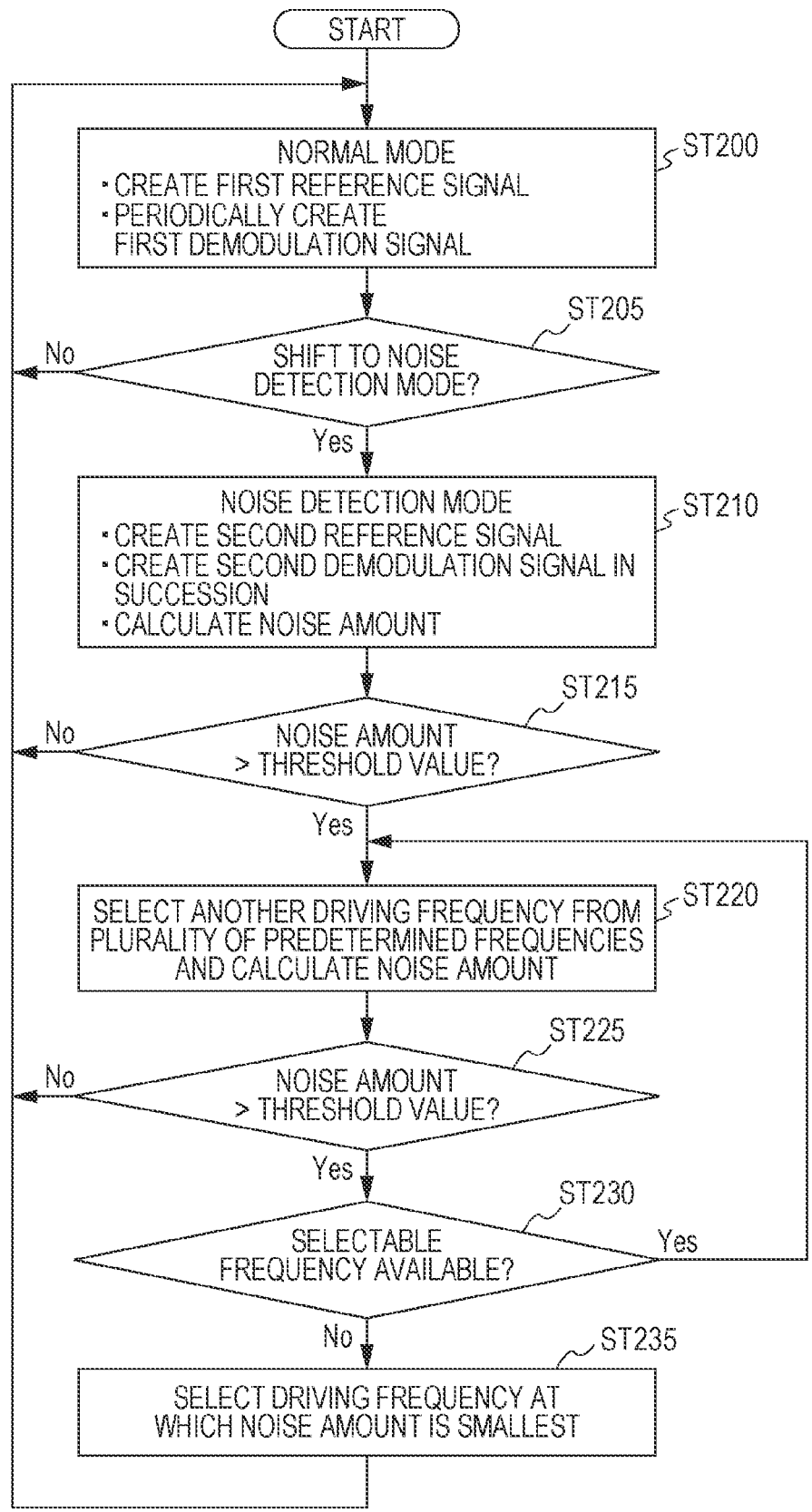
FIG. 5 is a flowchart used to illustrate another example of the operation of the sensor device in FIG. 1.

FIG. 5 is a flowchart used to illustrate another example of the operation of the sensor device according to this embodiment. Descriptions of steps ST200 and ST205 in the flowchart illustrated in FIG. 5 will be omitted because these steps are the same as steps ST100 and ST105 in the flowchart illustrated in FIG. 4.

When a time to shift to the noise detection mode comes (Yes in ST205), the control unit 501 temporarily switches the operation mode from the normal mode to the noise detection mode (ST210).

Upon the shift to the noise detection mode, the control unit 501 creates the second reference signals FB1 to FBn in the reference signal creating unit 40 without changing the driving frequency fd in the normal mode, and repeats the creation of the second demodulation signals DB1 to DBn in the demodulating unit 20 (ST210).

The control unit 501 calculates n noise amounts N1 to Nn according to a plurality of second demodulation signals DB1 to DBn created in succession and obtains a representative value of the noise amounts from the calculation results (ST210). The control unit 501 then decides whether the representative value of the noise amounts exceeds a predetermined threshold value (ST215).

If the representative value of the noise amounts is smaller than or equal to the predetermined threshold value (No in ST215), the control unit 501 returns the operation mode from the noise detection mode to the normal mode and repeats the operation in step ST200.

If the representative value of the noise amounts exceeds the predetermined threshold value (Yes in ST215), the control unit 501 selects another driving frequency fd from a plurality of predetermined frequencies. For example, the control unit 501 selects the next frequency after the current driving frequency fd as a new driving frequency fd, according to a sequence predetermined for the plurality of frequencies. It will be assumed here that, for example, the plurality of frequencies are determined to be f1, f2, f3, f4, and f5 and their sequence is determined to be f1, f2, f3, f4, f5, f1, f2, f3, • • •. Then, if the current driving frequency fd is f5, the control unit 501 selects f1, which is next after f5, as a new driving frequency fd (ST220).

The control unit 501 creates the sinusoidal signal W having the selected driving frequency fd in the sine wave generating unit 30 and sets the driving frequency fd of the driving signal Vd accordingly. The control unit 501 also repeats the creation of the second demodulation signals DB1 to DBn in the demodulating unit 20 while creating the second reference signals FB1 to FBn in the reference signal creating unit 40 (ST220).

The control unit 501 calculates n noise amounts Ni to Nn according to a plurality of second demodulation signals DB1 to DBn created in succession, obtains a representative value of the noise amounts from the calculation results (ST220), and decides whether the representative value of the noise amounts exceeds a predetermined threshold value (ST225).

If the representative value of the noise amounts is smaller than or equal to the predetermined threshold value (No in ST225), the control unit 501 returns the operation mode from the noise detection mode to the normal mode and repeats the operation in step ST200.

If the representative value of the noise amounts exceeds the predetermined threshold value (Yes in ST225), the control unit 501 decides whether there is a frequency yet to be selected from the plurality of predetermined frequencies as the driving frequency fd in step ST220 (ST230). If there is a frequency yet to be selected in step ST220 (Yes in ST230), the control unit 501 selects that frequency as the driving frequency fd, and repeats the operations in step ST220 and later. If all frequencies have been selected in step ST220 (No in ST230), the control unit 501 compares noise amounts (each of which is a representative value obtained from n noise amounts Ni to Nn) at all driving frequencies fd selected in step ST220, and selects, as a new driving frequency fd, a driving frequency fd at which the noise amount was the smallest (ST235). Then, the control unit 501 returns the operation mode from the noise detection mode to the normal mode and repeats the operation in step ST200.

CONCLUSION

According to this embodiment, in a normal mode, a detection signal Si that has a frequency equal to the driving frequency fd of a driving signal Vd and also has a predetermined phase $\phi i$ with respect to the driving signal Vd and a reference signal FAi of a sine wave that has a frequency equal to the driving frequency fd and also has the predetermined phase $\phi i$ with respect to the driving signal Vd are multiplied together. A direct-current component included in a signal Y1 obtained as the result of this multiplication has a magnitude matching the amplitude of the detection signal Si, that is, the magnitude matching the capacitance of a capacitor Cx, as indicated in equation (1). Therefore, a first demodulation signal DAi created by the demodulating unit 20 has a magnitude matching the capacitance of the capacitor Cx.

According to this embodiment, in a noise detection mode, the detection signal Si and a second reference signal FBi that has a frequency equal to the driving frequency fd and the phase of which is shifted by a one-fourth cycle when compared with the first reference signal FAi, the phase being with respect to the driving signal Vd, are multiplied together. A direct-current component included in a signal obtained as the result of this multiplication does not practically include a component of a signal having the predetermined phase $\phi i$ with respect to the driving signal Vd, that is, a component matching the detection signal Si, but has a magnitude matching a noise component having the same frequency as the driving frequency fd, as indicated in equation (2). Therefore, a second demodulation signal DBi created by the demodulating unit 20 has a magnitude matching a noise component having the same frequency as the driving frequency fd, the noise component being superimposed on the detection signal Si. That is, it is possible to examine a noise component having the same frequency as the driving frequency fd, the noise component being superimposed on the detection signal Si, according to the second demodulation signal DBi.

According to this embodiment, a noise amount related to a noise component having the same frequency as the driving frequency fd is calculated according to a time-varying change in the second reference signal FBi. If this noise amount exceeds a threshold value, the driving frequency fd is changed, so a frequency leading to large noise is not used as the driving frequency fd. Therefore, the effect on the first reference signal FAi due to the mixing of noise is likely to be avoided.

According to this embodiment, if the sum of a plurality of noise amounts N calculated for a plurality of sensor units 10 exceeds a threshold value, it is decided that noise has been mixed and the driving frequency fd is changed. Therefore, even if noise, which affects the whole of a plurality of sensor units 10, is mixed, the effect on the first reference signal FAi due to the mixing of noise is likely to be avoided.

According to this embodiment, the predetermined phase φi of the first reference signal FAi with respect to the driving signal Vd is individually set for each of a plurality of sensor units 10. That is, a delay of the phase of the first reference signal FAi with respect to the driving signal Vd and a delay of the phase of the second reference signal FBi with respect to the driving signal Vd are individually set for each of a plurality of sensor units 10. Thus, even if the detection signal Si created in each sensor unit 10 has an individual phase φi with respect to the driving signal Vd, the predetermined phase of the first reference signal FAi with respect to the driving signal Vd can be set for each sensor unit 10 so as to match this individual phase 4i. Therefore, the phase of the first reference signal FAi and the phase of the detection signal Si can be made to precisely match each other. The difference in phase between the second reference signal FBi and the detection signal Si can be precisely set to a one-fourth cycle. When the difference in phase between the first reference signal FAi and the phase of the detection signal Si becomes small, sensitivity with which the detection signal Si is detected by the first demodulation signal DAi becomes high. When the phase difference between the second reference signal FBi and the detection signal Si approaches a one-fourth cycle, sensitivity with which a component (noise component) other than the detection signal Si is detected by the second demodulation signal DBi becomes high.

According to this embodiment, when the driving frequency fd is changed according to the result of a comparison between a noise amount and a threshold value, a driving frequency fd is selected from a plurality of predetermined frequencies. Therefore, it is possible to simplify the structure involved in changing the driving frequency fd.

According to this embodiment, the creation of the first demodulation signal DAi is periodically repeated in the normal mode, and an operation to shift from the normal mode to the noise detection mode and calculate a noise amount is periodically repeated. Therefore, even if the mixing of noise newly occurs, the driving frequency fd is automatically changed according to the result of a comparison between the noise amount and a threshold value. Therefore, the effect on the first demodulation signal DAi due to the mixing of noise is likely to be avoided.

According to this embodiment, each time a shift to the noise detection mode is temporarily made, a noise amount is calculated by using a driving frequency fd sequentially selected from a plurality of predetermined frequencies. If the noise amount exceeds a threshold value in the noise detection mode, the driving frequency fd in the latest noise detection mode in which the second demodulation signal DBi that makes a noise amount smaller than or equal to the threshold value was created is used as a new driving frequency fd in the normal mode. Thus, a frequency leading to small noise is likely to be selected at the latest time as the driving frequency fd, so the effect on the first demodulation signal DAi due to the mixing of noise is likely to be avoided.

The present invention is not limited to the embodiment described above. The present invention includes various variations.

Although, in the embodiment described above, the first demodulation signal DAi is created in the normal mode and the second demodulation signal DBi is created in the noise detection mode, for example. In another embodiment of the present disclosure, however, the first demodulation signal DAi and second demodulation signal DBi may be concurrently created.

Figure 6:
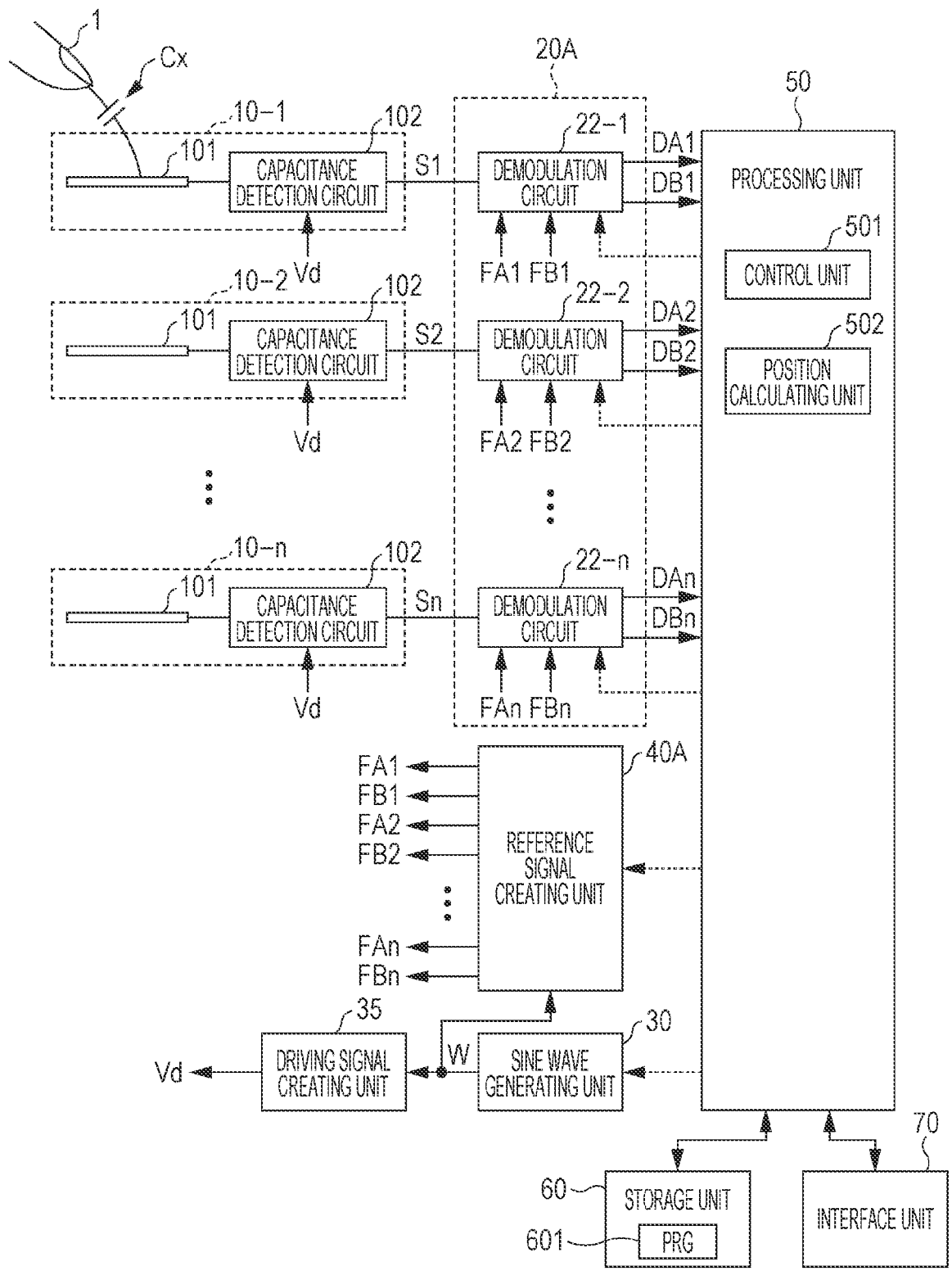
FIG. 6 illustrates an example of the structure of a sensor device according to another embodiment.

FIG. 6 illustrates an example of the structure of a sensor device according to another embodiment. In the sensor device illustrated in FIG. 6, a demodulating unit 20A and a reference signal creating unit 40A are substituted for the demodulating unit 20 and reference signal creating unit 40 in the sensor device illustrated in FIG. 1.

Figure 7:
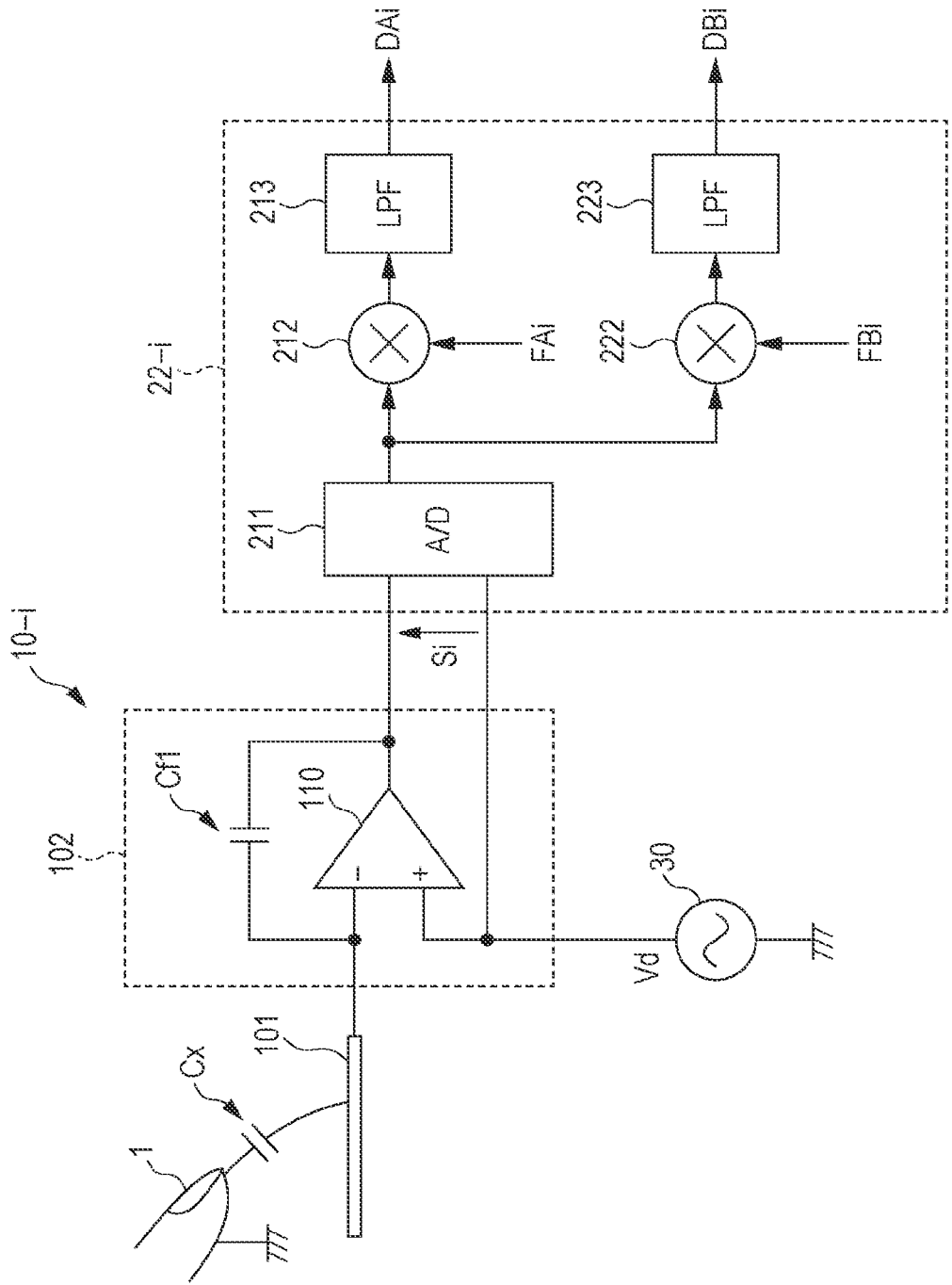
FIG. 7 illustrates an example of the structures of a capacitance detection circuit and demodulation circuit in the sensor device in FIG. 6.

The demodulating unit 20A includes n demodulation circuits 22-1 to 22-n corresponding to n demodulation circuits 21-1 to 21-n (see FIG. 1) in the demodulating unit 20 as illustrated, for example, FIG. 7. In addition to a structure similar to the structure of the demodulation circuit 21-i (see FIG. 2), the demodulation circuit 22-i includes a multiplication circuit 222 that performs a multiplication between the second reference signal FBi and an output signal (signal obtained by digitizing the detection signal Si) from the A/D converter 211, and also includes a low-pass filter 223 that extracts a direct-current component from the result of the multiplication in the multiplication circuit 222. The low-pass filter 223 outputs the second demodulation signal DBi. In the example in FIG. 6, the multiplication circuit 212 accepts the first reference signal FAi and the low-pass filter 213 outputs the first demodulation signal DAi.

Figure 8:
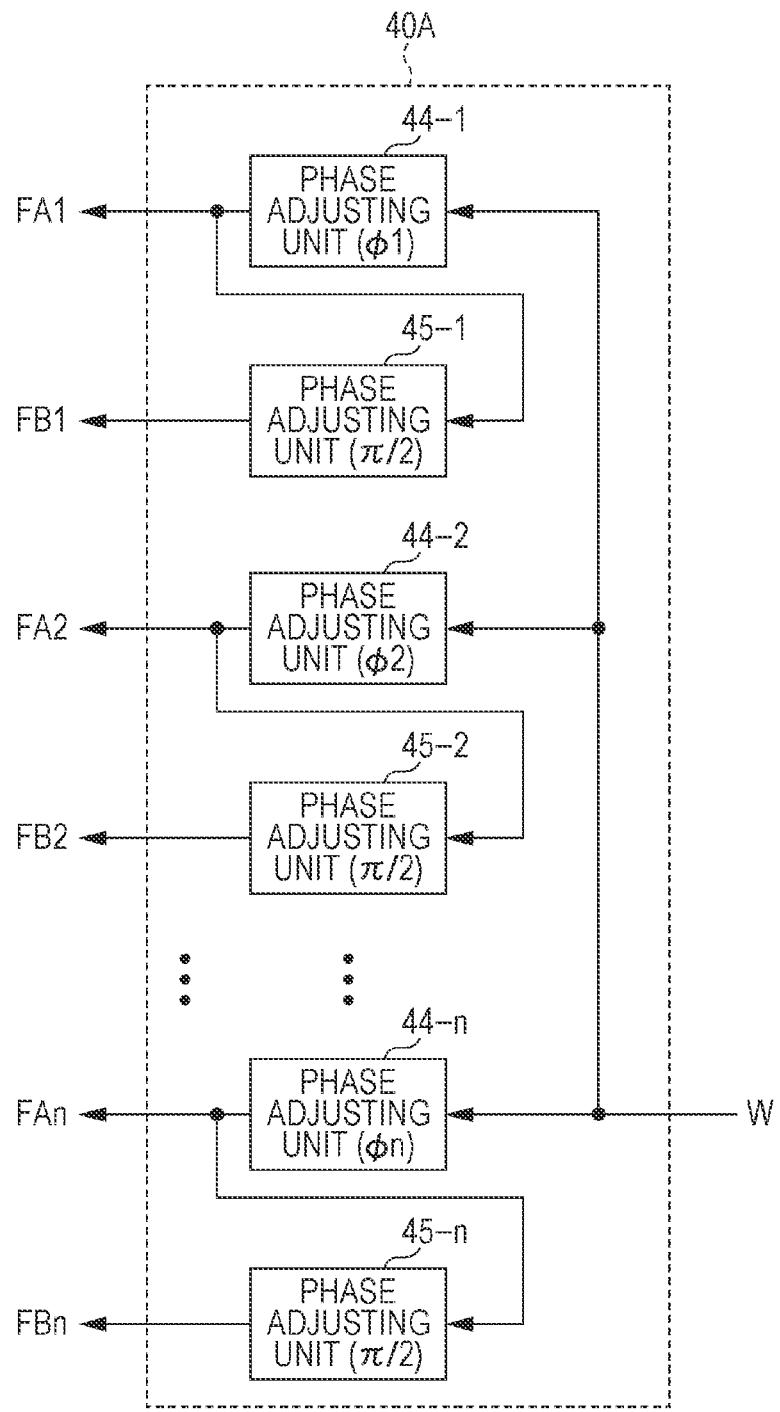
FIG. 8 illustrates an example of the structure of a reference signal creating unit in the sensor device in FIG. 6.

The reference signal creating unit 40A illustrated in FIG. 8 concurrently creates the first reference signal FAi and second reference signal FBi from the sinusoidal signal W. In the reference signal creating unit 40A illustrated in FIG. 8, the phase adjusting unit 42 and multiplexer 43 are eliminated from the reference signal creating unit 40 illustrated in FIG. 3 and phase adjustment units 45-1 to 45-n used to input the sinusoidal signal W to the phase adjusting units 44-1 to 44-n and create the second reference signal FB1 to FBn are newly added. The phase adjusting unit 44-i outputs a signal the phase of which is shifted by a one-fourth cycle from the phase of the first reference signal FAi, as the second reference signal FBi.

The sensor device illustrated in FIGS. 6 to 8 has more constituent parts in the circuit than the sensor device illustrated in FIGS. 1 to 3, but can more often detect noise by concurrently creating the first demodulation signal DAi and second demodulation signal DBi. Therefore, the effect on the first demodulation signal DAi due to the mixing of noise is likely to be further effectively avoided.

In the embodiment described above, an example has been taken in which the phase of the second reference signal FBi is shifted by a one-fourth cycle from the phase of the detection signal Si (phase of the first reference signal FAi). With the sensor device in the other embodiment of the present disclosure, however, the phase shift between the second reference signal FBi and the detection signal Si may be other than a one-fourth cycle. In this case as well, the correlation of the second demodulation signal DBi to the detection signal Si becomes low and the correlation of the second demodulation signal DBi to a noise component having the same frequency as the detection signal Si becomes high, when compared with the first demodulation signal DAi. Therefore, it is possible to examine a noise component having the same frequency as the driving frequency fd, the noise component being superimposed on the detection signal Si, according to the second demodulation signal DBi.

In the embodiment described above, the first reference signal FAi and second reference signal FBi are created according to the driving signal Vd to be supplied to the sensor unit 10. With the sensor device in the other embodiment of the present disclosure, however, the first reference signal FAi and second reference signal FBi may be created according to another signal related to the detection signal Si or to the detection signal Si itself output by the sensor unit 10.

In the embodiment described above, an example of a self-capacitive sensor device that detects the capacitance of a capacitor formed between an electrode and an object has been taken. However, the sensor device in the other embodiment of the present disclosure may be a mutual capacitive sensor device that detects the capacitance of a capacitor formed between two electrodes.

In the embodiment described above, an example of a sensor device that detects a capacitance has been taken. The sensor device according to the technology in the present disclosure can also be widely used as one of sensor devices that detect various physical quantities other than capacitance.

What is claimed is:

1. A sensor device comprising:
    at least one sensor unit configured to output a detection signal, the detection signal being a sign wave having an amplitude corresponding to a physical quantity detected;
    a reference signal generation unit configured to generate a first reference signal and a second reference signal, the first reference signal being a sine wave having a frequency equal to a frequency of the detection signal and a phase equal to a phase of the detection signal, and the second reference signal being a sine wave having a frequency equal to the frequency of the detection signal and a phase shifted from the phase of the detection signal; and
    a demodulating unit configured to multiply the detection signal by the first reference signal to generate a first multiplied signal having a direct-current component, thereby outputting a first demodulation signal corresponding to the physical quantity detected, and to multiply the detection signal by the second reference signal to generate a second multiplied signal having a direct-current component, thereby outputting a second demodulation signal corresponding to a noise component superimposed on the detection signal.

2. The sensor device according to claim 1, wherein the phase of the second reference signal is shifted by a one-fourth cycle from the phase of the detection signal.

3. The sensor device according to claim 1, further comprising:
    a driving signal generation unit configured to generate a driving signal for driving the at least one sensor unit, the driving signal being a sine wave having a driving frequency, the detection signal having the driving frequency; and
    a control unit configured to calculate a noise amount corresponding to a time-varying change in the second demodulation signal, and if the calculated noise amount exceeds a threshold value, to change the driving frequency.

4. The sensor device according to claim 3, wherein the control unit is further configured to calculate the noise amount according to a plurality of second demodulation signals sequentially generated in the demodulating unit.

5. The sensor device according to claim 3, comprising a plurality of sensor units, wherein:
    the demodulating unit is configured to generate the first demodulation signal and the second demodulation signal for each of the plurality of sensor units; and
    the control unit is configured to calculate the noise amount for each of the plurality of sensor units, and if a sum of a plurality of noise amounts calculated for the plurality of sensor units exceeds a threshold value, to change the driving frequency.

6. The sensor device according to claim 3, comprising a plurality of sensor units, wherein:
    each of the plurality of sensor units is configured to output the detection signal with a phase delay with respect to the driving signal;
    the demodulating unit is configured to generate the first demodulation signal and the second demodulation signal for each of the plurality of sensor units;
    the reference signal generation unit is configured to generate the first reference signal and the second reference signal based on the driving signal for each of the plurality of sensor units; and
    the control unit is configured to individually set a first phase delay for the first reference signal and a second phase delay for the second reference signal with respect to the driving signal for each of the plurality of the sensor units.

7. The sensor device according to claim 3, wherein the control unit is further configured to select, when changing the driving frequency, a new driving frequency different from a current driving frequency from among a plurality of predetermined frequencies.

8. The sensor device according to claim 3,
    wherein the control unit is further configured to provide a normal mode for detecting the physical quantity and a noise detection mode for detecting the noise, thereby controlling the reference signal generation unit and the demodulating unit, such that the first reference signal and the first demodulation signal are generated in the normal mode, while the second reference signal and the second demodulation signal are generated in the noise detection mode,
    and wherein the control unit calculates the noise amount in the noise detection mode, and if the noise amount exceeds the threshold value, the control unit changes the driving frequency for the normal mode.

9. The sensor device according to claim 8, wherein the control unit is further configured to control the demodulation unit such that the first demodulation signal is periodically generated in the normal mode, and to periodically and temporarily shift from the normal mode to the noise detection mode to calculate the noise amount.

10. The sensor device according to claim 9, wherein the control unit is further configured such that:
    each time the control unit temporarily shifts from the normal mode to the noise detection mode, the control unit sequentially selects a frequency to be used as the driving frequency in the noise detection mode from among a plurality of predetermined frequencies; and
    the control unit selects, as a new driving frequency for the normal mode, the driving frequency used in a latest noise detection mode in which the second demodulation signal yielded the calculated noise amount smaller than or equal to the threshold value.

11. The sensor device according to claim 1, further comprising a driving signal generation unit configured to generate a driving signal which is a sine wave,
wherein the sensor unit includes:
at least one electrode that forms a capacitor having a capacitance which changes according to a degree of proximity of an object; and
a capacitance detection circuit configured to apply the driving signal to the capacitor through the electrode, thereby generating the detection signal corresponding to an electric charge transferred to the capacitor according to the driving signal applied thereto, the detection signal having an amplitude corresponding to the capacitance of the capacitor.

12. A method of controlling a sensor device including at least one sensor unit, a driving signal generation unit, a reference signal generation unit, and a demodulating unit, the method comprising:
generating a driving signal via the driving signal generation unit, the driving signal being a sine wave having a driving frequency;
outputting a detection signal via the sensor unit according to the driving signal, the detection signal being a sine wave having a frequency equal to the driving frequency and an amplitude corresponding to a physical quantity detected by the sensor unit;
controlling the reference signal generation unit in a normal mode for detecting the physical quantity, so as to generate a first reference signal, the first reference signal being a sine wave having a frequency equal to the frequency of the detection signal and a phase equal to a phase of the detection signal;
controlling, in the normal mode, the demodulating unit so as to multiply the detection signal by a first reference signal to generate a first multiplied signal having a direct-current component, thereby outputting a first demodulation signal corresponding to the physical quantity detected;
controlling the reference signal generation unit in a noise detection mode for detecting the noise, so as to generate a second reference signal, the second reference signal being a sine wave having a frequency equal to the frequency of the detection signal and a phase shifted from the phase of the detection signal;
controlling, in the noise detection mode, the demodulating unit so as to multiply the detection signal by the second reference signal to generate a second multiplied signal having a direct-current component, thereby outputting a second demodulation signal corresponding to a noise component superimposed on the detection signal;
calculating a noise amount corresponding a time-varying change in the second demodulation signal in the noise detection mode; and
changing, if the calculated noise amount exceeds a threshold value, the driving frequency for the normal mode.

13. A non-transitory program storage device readable by machine, which causes a computer to execute the method of claim 12 for controlling a sensor device.

* * * * *